(12) United States Patent
Fujiwara

(10) Patent No.: US 9,525,378 B2
(45) Date of Patent: Dec. 20, 2016

(54) MOTOR CONTROL DEVICE

(71) Applicant: Panasonic Intellectual Property Management Co., Ltd., Osaka (JP)

(72) Inventor: Hiroshi Fujiwara, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/901,698

(22) PCT Filed: Jul. 3, 2014

(86) PCT No.: PCT/JP2014/003549
§ 371 (c)(1),
(2) Date: Dec. 28, 2015

(87) PCT Pub. No.: WO2015/004885
PCT Pub. Date: Jan. 15, 2015

(65) Prior Publication Data
US 2016/0344326 A1  Nov. 24, 2016

(30) Foreign Application Priority Data
Jul. 9, 2013  (JP) .................................. 2013-143188

(51) Int. Cl.
*G05B 19/29* (2006.01)
*G05B 13/02* (2006.01)
(Continued)

(52) U.S. Cl.
CPC ............ *H02P 21/14* (2013.01); *G05B 13/042* (2013.01); *G06N 99/005* (2013.01); *H03H 17/06* (2013.01); *B25J 9/1605* (2013.01)

(58) Field of Classification Search
CPC .... G05B 13/042; G06N 99/005; H03H 17/06; B25J 9/1605; H02P 21/14
(Continued)

(56) References Cited

U.S. PATENT DOCUMENTS 6,505,085 B1 *  1/2003  Tuttle .................... B25J 9/1605
                                                                 700/28

FOREIGN PATENT DOCUMENTS

JP    2008-310651    12/2008
JP    2010-086395    4/2010

OTHER PUBLICATIONS

International Search Report of PCT application No. PCT/JP2014/003549 dated Sep. 30, 2014.

* cited by examiner

*Primary Examiner* — Bentsu Ro
*Assistant Examiner* — Zemenay Truneh
(74) *Attorney, Agent, or Firm* — Hamre, Schumann, Mueller & Larson, P.C.

(57) ABSTRACT

A motor control device of the present invention includes a position detector (107), a feedforward controller, a predistorter, a feedback controller, a vibration suppression controller, a torque controller, a torque estimator, and an adjustment calculator. The vibration suppression controller receives a manipulation-quantity command value derived by addition of a feedforward manipulation quantity and a feedback manipulation quantity, and outputs an actual manipulation-quantity command value corresponding to the received manipulation-quantity command value. The torque controller controls a manipulation quantity generated by the motor so that the manipulation quantity matches the actual manipulation-quantity command value. The adjustment calculator adjusts a transfer characteristic of the predistorter such that the transfer characteristic becomes equal to a transfer characteristic from the manipulation-quantity command value to the manipulation quantity.

12 Claims, 4 Drawing Sheets

(51) Int. Cl.
  *H02P 21/14* (2016.01)
  *H03H 17/06* (2006.01)
  *G06N 99/00* (2010.01)
  *G05B 13/04* (2006.01)
  *B25J 9/16* (2006.01)
(58) Field of Classification Search
  USPC .......................................... 700/28; 318/600
  See application file for complete search history.

MOTOR CONTROL DEVICE

TECHNICAL FIELD

The present invention relates to control devices for motors used in such apparatuses as mounting machines for electronic components and manufacturing equipment for semiconductors, and in particular, relates to a motor control device having a function of adjusting a transfer characteristic of a predistorter.

BACKGROUND ART

Motor control devices hitherto available include a type that is configured to adjust a transfer characteristic of a predistorter to make it equal to a transfer characteristic from a state-quantity command value to a state-quantity detected value for a controlled object having a dead time. Such a motor control device thus reduces a deviation between a state quantity and a state quantity command, and obtains a high following performance.

A motor control device disclosed in patent literature 1 is one example of such motor control devices.

FIG. 4 is a block diagram showing a conventional motor control device. As shown in FIG. 4, controlled object 206 of this example is a motor and a load attached to the motor. As for controlled object 206, a position defined as a state quantity changes with a torque defined as a manipulation quantity.

Position detector 207 detects a position of controlled object 206, and outputs a position detected value. Feedforward controller 201 generates a feedforward manipulation quantity based on a position command value provided by a host controller. Predistorter 202 generates a position command corrected value based on the position command value. Feedback controller 203 generates a feedback manipulation quantity based on a difference between the position command corrected value and the position detected value. Torque controller 205 makes use of the sum of the feedforward manipulation quantity and the feedback manipulation quantity as a torque command value. Torque controller 205 controls the torque so that the torque becomes equal to the torque command value. Adjustment calculator 209 adjusts predistorter 202 according to the position command corrected value and the position detected value.

Predistorter 202 is implemented by means of an infinite impulse response ("IIR") adaptive filter of a digital controller in order to set a transfer function of predistorter 202 as close to a feedforward error as possible. The feedforward error is a difference between a transfer function of controlled object 206 and a transfer function of a controlled object model used for feedforward controller 201. Adjustment calculator 209 calculates and sets a filter factor of predistorter 202 from the position command corrected value and the position detected value according to an adaptive law.

CITATION LIST

Patent Literature

PTL 1: Japanese Unexamined Patent Publication, No. 2008-310651

SUMMARY

A motor control device that is an object of the present invention includes a state quantity detector, a feedforward controller, a variable predistorter, a feedback controller, a vibration suppression controller, a manipulation quantity controller, a manipulation quantity estimator, and an adjustment calculator.

The state quantity detector detects a movement of the motor, and calculates a quantity of the movement of the motor. The state quantity detector then outputs the calculated quantity of the movement as a state quantity detected value.

The feedforward controller receives a state-quantity command value that is an input to direct operation. The feedforward controller outputs a feedforward manipulation quantity corresponding to the received state-quantity command value.

The variable predistorter also receives the state-quantity command value. The variable predistorter then outputs a state-quantity command corrected value produced by correcting the received state-quantity command value.

The feedback controller receives a difference between the state-quantity command corrected value and the state-quantity detected value. The feedback controller then outputs a feedback manipulation quantity corresponding to the received difference between the state-quantity command corrected value and state-quantity detected value.

The vibration suppression controller receives a manipulation-quantity command value that is a value derived by addition of the feedforward manipulation quantity and the feedback manipulation quantity. The vibration suppression controller outputs an actual manipulation-quantity command value corresponding to the received manipulation-quantity command value.

The manipulation quantity controller controls a manipulation quantity generated by the motor such that the manipulation quantity generated by the motor matches the actual manipulation-quantity command value.

The manipulation quantity estimator receives the state-quantity detected value. The manipulation quantity estimator then outputs a manipulation-quantity estimated value corresponding to the received state-quantity detected value.

The adjustment calculator adjusts a transfer characteristic of the predistorter.

Specifically, the adjustment calculator adjusts the transfer characteristic of the predistorter so that the transfer characteristic becomes equal to a transfer characteristic from the manipulation-quantity command value to the manipulation quantity.

DESCRIPTION OF PREFERRED EMBODIMENTS

Motor control devices according to exemplary embodiments of the present invention are capable of reducing vibrations by virtue of configurations described later. The vibrations include such vibrations that are attributed to roughness in detecting resolution by a state quantity detector. The vibrations also include another kind that is attributed to resonance of a mechanical system.

Moreover, the motor control devices according to the exemplary embodiments of the invention can implement high following performance even when the predistorter is under adjusting operation.

In other words, conventional motor control devices had the following matters that need to be improved. That is, the conventional motor control devices are influenced by the vibrations attributed to roughness in detecting resolution by their state quantity detectors. In addition, the conventional motor control devices are influenced by the vibrations attributed to resonance of the mechanical systems. It is determined that the conventional motor control devices are unable to suppress the vibrations due to lack of consideration on these vibrations.

Furthermore, the adjustment calculator calculates a transfer function of the predistorter based on a position command corrected value and a position detected value. The position detected value is under influence of control operation of the feedback controller. It is therefore necessary to reduce a control gain of the feedback controller while the predistorter is being adjusted. As a result, a two-degree-of-freedom controller is liable to a decrease in following performance while the predistorter is in the adjusting operation.

Description is provided hereinafter about each of the exemplary embodiments of the present invention with reference to the accompanying drawings. The following exemplary embodiments are only examples of implementing the present invention, and they should not be construed as limiting the scope of the invention.

First Exemplary Embodiment

Figure 1:
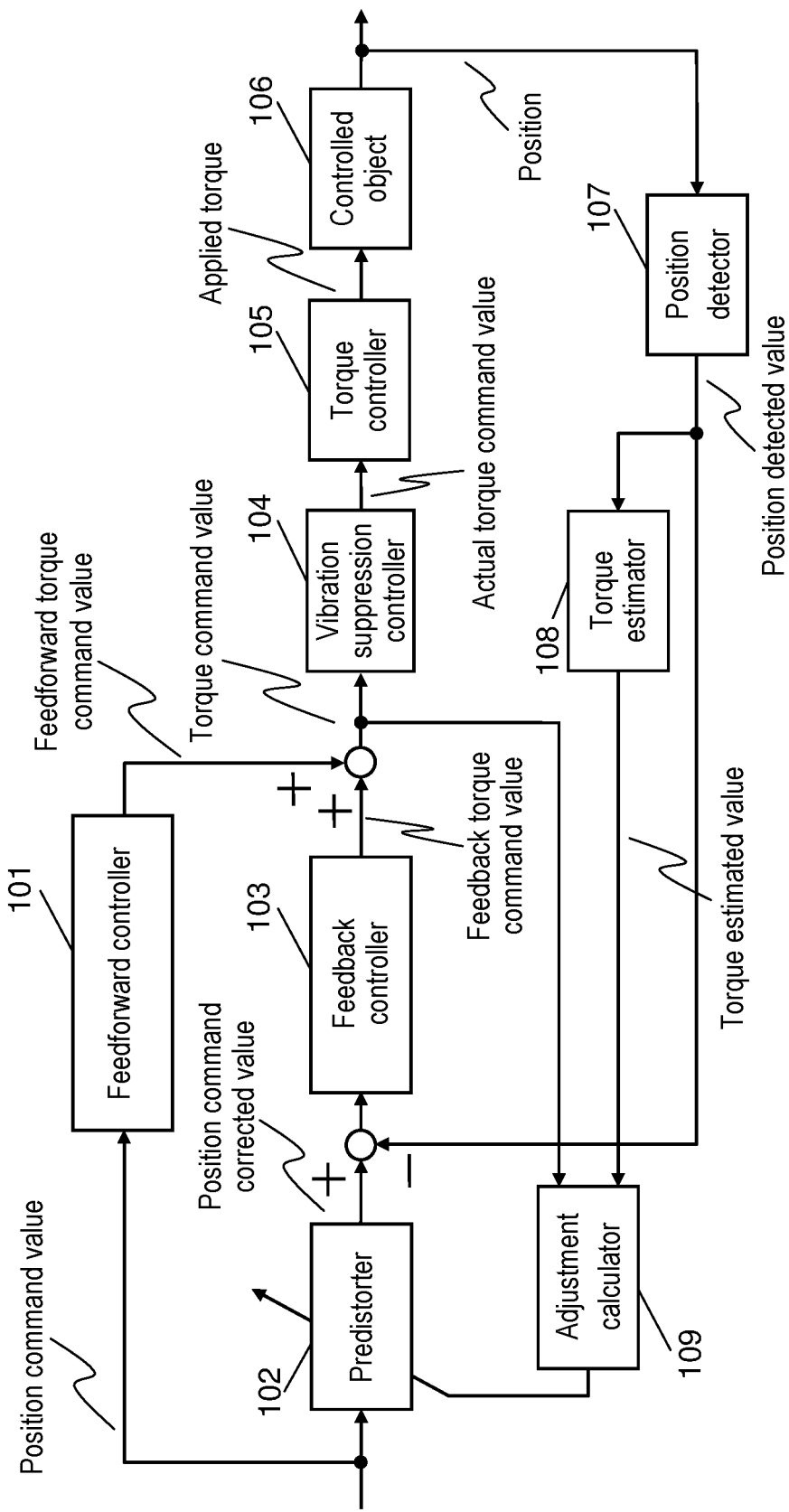
FIG. 1 is a block diagram showing a motor control device according to a first exemplary embodiment of the present invention.

FIG. 1 is a block diagram showing a motor control device according to the first exemplary embodiment of the present invention.

As shown in FIG. 1 the motor control device of the first embodiment of the invention includes a state quantity detector that can be implemented with position detector 107 for instance, feedforward controller 101, variable predistorter 102, feedback controller 103, vibration suppression controller 104, a manipulation quantity controller that can be implemented with torque controller 105 for instance, a manipulation quantity estimator that can be implemented for instance with torque estimator 108, and adjustment calculator 109.

The state quantity detector, shown as position detector 107 in FIG. 1, detects a movement of a motor, and calculates a quantity of the movement of the motor. The state quantity detector then outputs the calculated quantity of the movement as a state-quantity detected value. The quantity of movement of the motor is shown as position information of the motor. The state-quantity detected value is shown as a position detected value.

Feedforward controller 101 receives a state-quantity command value which is an input for directing operation. Feedforward controller 101 outputs a feedforward manipulation quantity that corresponds to the received state-quantity command value. As a specific example in FIG. 1, the state-quantity command value is shown as a position command value provided by a host controller. The feedforward manipulation quantity is shown here as a feedforward torque command value.

Variable predistorter 102 receives the state-quantity command value as an input. Variable predistorter 102 then outputs a state-quantity command corrected value produced by correcting the received state-quantity command value. The state-quantity command corrected value is shown as a position command corrected value, as a specific example in FIG. 1.

Feedback controller 103 receives a difference between the state-quantity command corrected value and the state-quantity detected value. Feedback controller 103 outputs a feedback manipulation quantity corresponding to the received difference between the state-quantity command corrected value and state-quantity detected value. The feedback manipulation quantity is shown as a feedback torque command value, as a specific example in FIG. 1.

Vibration suppression controller 104 receives a manipulation-quantity command value that is a value derived by addition of the feedforward manipulation quantity and the feedback manipulation quantity. Vibration suppression controller 104 then outputs an actual manipulation-quantity command value corresponding to the received manipulation-quantity command value. The manipulation-quantity command value is shown as a torque command value, as a specific example in FIG. 1. The actual manipulation-quantity command value is shown as an actual torque command value.

The manipulation quantity controller, shown as torque controller 105 in FIG. 1, controls a manipulation quantity generated by the motor such that the manipulation quantity generated by the motor matches the actual manipulation-quantity command value. The manipulation quantity is shown as a torque.

The manipulation quantity estimator shown as torque estimator 108 in FIG. 1 receives the state-quantity detected value. The manipulation quantity estimator outputs a manipulation-quantity estimated value corresponding to the received state-quantity detected value. The manipulation-quantity estimated value is shown as a torque estimated value.

Adjustment calculator 109 adjusts a transfer characteristic of predistorter 102.

In particular, adjustment calculator 109 adjusts the transfer characteristic of predistorter 102 so that the transfer characteristic becomes equal to a transfer characteristic from the manipulation-quantity command value to the manipulation quantity.

Vibrations described below can be reduced by virtue of this configuration. The vibrations include such vibrations that are attributed to roughness in detecting resolution by position detector 107, i.e., the state quantity detector. The vibrations also include another kind attributed to resonance of the mechanical system. According to this configuration, however, the adjustment of predistorter 102 can be carried out without reducing a control gain of feedback controller 103. The motor control device according to the first embodiment of this invention can hence implement high following performance during the adjusting operation of predistorter 102.

Specific configurations that can exhibit outstanding advantage and effect are as described below. That is, in the motor control device according to the first embodiment, feedforward controller 101 and torque estimator 108 functioning as the manipulation quantity estimator include a computational algorithm of the same configuration. More specifically, both feedforward controller 101 and torque estimator 108 that functions as the manipulation quantity estimator, use the same computational algorithm when calculating output values on the basis of their respective input values.

According to this configuration, there also exhibits the following advantage and effect in addition to those described above. That is, the manipulation quantity generated by the motor can be estimated highly accurately from the state-quantity detected value, according to this configuration. It thus becomes possible to reduce a deviation between the manipulation-quantity command value and the manipulation quantity generated by the motor. As a result, the motor control device of the first embodiment can achieve high following performance.

In the first embodiment, vibration suppression controller 104 is made up of at least one infinite impulse response ("IIR") filter, at least one finite impulse response ("FIR") filter, or a combination of at least one IIR filter and at least one FIR filter.

This configuration can remove a component that excites the vibrations from the manipulation-quantity command value. Accordingly, the motor control device of the first embodiment can reduce the vibrations attributed to roughness in detecting resolution by position detector 107, i.e. the state quantity detector, as well as the vibrations attributed to resonance of the mechanical system.

In the first exemplary embodiment, predistorter 102 is also made up of an IIR filter or an FIR filter.

According to this configuration, it is possible to have the state-quantity command value undergo a filtering process that is equivalent to the transfer characteristic from the manipulation-quantity command value to the manipulation quantity generated by the motor. It can thus reduce an amount of deviation between the state-quantity command corrected value and the state-quantity detected value input to feedback controller 103. As a result, the motor control device of the first embodiment can achieve high following performance.

In the first exemplary embodiment, adjustment calculator 109 implements correction of a filter factor of the IIR filter or the FIR filter by using a least-square method.

In addition, adjustment calculator 109 in the first embodiment implements correction of the filter factor of the IIR filter or the FIR filter successively according to an adaptive law.

Alternatively, adjustment calculator 109 in the first embodiment changes the filter factor of the IIR filter or the FIR filter, and a filtration degree of the IIR filter or the FIR filter. Adjustment calculator 109 obtains the filtration degree and the filter factor of such values that minimize the difference between the manipulation-quantity command value and the manipulation-quantity estimated value according to a learning rule.

According to this configuration, predistorter 102 can be adjusted to have an optimum transfer characteristic. As a result, the motor control device of the first embodiment can achieve high following performance.

In addition, the motor control device of the first embodiment further has a threshold used to determine a feedback manipulation quantity.

Adjustment calculator 109 changes the filter factor of predistorter 102 when the feedback manipulation quantity exceeds the threshold. Adjustment calculator 109 keeps the filter factor of predistorter 102 unchanged when the feedback manipulation quantity does not exceed the threshold.

According to this configuration, predistorter 102 is adjusted when the transfer characteristic of predistorter 102 differs substantially as compared to the transfer characteristic from the manipulation-quantity command value to the manipulation quantity. Predistorter 102 can thus be adjusted steadily.

Description is provided in further detail by referring to the drawing.

In the first embodiment shown in FIG. 1, controlled object 106 represents an apparatus of mechanical system that is an electric motor and a load attached to the motor, as a concrete example. The apparatus of mechanical system shown as controlled object 106 is driven by a torque the motor generates. Position detector 107 detects position information that represents a quantity of movement of the motor. Position detector 107 outputs a result of the detection as a position detected value.

Feedforward controller 101 receives the position command value provided by the host controller. Feedforward controller 101 then outputs a feedforward torque command value. The feedforward torque command value is intended to drive controlled object 106 so that a position of controlled object 106 becomes equal to the position command value. Predistorter 102 corrects the position command value in a manner to make the position of the controlled object set by the feedforward torque command value become equal to the position detected value. Predistorter 102 receives the position command value, and outputs a position command corrected value.

Feedback controller 103 receives an amount of deviation between the position command corrected value and the position detected value. Feedback controller 103 outputs a feedback torque command value aimed at reducing the received amount of deviation. Vibration suppression controller 104 removes a component that excites vibrations of the mechanical system from the torque the motor generates. Vibration suppression controller 104 receives a torque command value that is a value derived by addition of the feedforward torque command value and the feedback torque command value. Vibration suppression controller 104 removes the component that excites vibrations of the mechanical system, and outputs the resulting torque command value as an actual torque command value.

Torque controller 105 controls a torque applied to the motor so that a torque generated by the motor matches the actual torque command value. Torque estimator 108 estimates the torque generated by the motor. Torque estimator 108 receives the position detected value. Torque estimator 108 outputs a torque estimated value that is an estimated value of the torque generated by the motor.

Adjustment calculator 109 receives the torque command value and the torque estimated value. Adjustment calculator 109 adjusts a transfer characteristic of predistorter 102 so that the transfer characteristic of predistorter 102 becomes equal to a transfer characteristic from the torque command value to the torque generated by the motor.

The motor control device constructed as above operates and functions in a manner which is described hereinafter.

In this exemplary embodiment, assuming that a transfer function of controlled object 106 is G(s), where s is a Laplacian operator, and controlled object 106 is a rigid load having inertia J, for instance, then, the transfer function Gp(s) in this example is given by the following equation (1).

$$G_p(s) = \frac{1}{Js^2} \quad (1)$$

Description is provided next about feedforward controller 101. Feedforward controller 101 calculates a feedforward torque command value so that a position of controlled object 106 matches the received position command value, and outputs the feedforward torque command value. The feedforward torque command value means a torque that needs to be generated by the motor.

Assuming that a transfer function of a model of controlled object 106 is Gm(z), and a transfer function of feedforward controller 101 is $Gm^{-1}(z)$, then the transfer function $Gm^{-1}(z)$ in this example is expressed by the following equation (2):

$$G_m^{-1}(z) = J \cdot \frac{1}{T_s^2} \cdot \frac{1 - 2z^{-1} + z^{-1}}{1} \qquad (2)$$

where z is an operator of z-transformation, and Ts is a sampling period of the motor control device.

However, the position command value input to feedforward controller 101 and the position of controlled object 106 do not match, even when the motor control device uses feedforward controller 101 expressed by the equation (2). A main factor of this is described as the following explanations.

Assume that transfer functions of vibration suppression controller 104 are denoted by Gtf(s) and Gtf(z). Vibrations are excited in the mechanical system attributed to roughness in the detecting resolution of position detector 107. Vibration suppression controller 104 is intended to reduce these vibrations excited in the mechanical system. Vibration suppression controller 104 can be implemented with a low-pass filter or the like element that removes frequency components of a high frequency band. In this instance, transfer function Gtf(s) of vibration suppression controller 104 is expressed by the following equation (3) for one example, and transfer function Gtf(z) is expressed by the following equation (4) for one example.

$$G_{tf}(s) = \frac{1}{\tau_{tf} s + 1} \qquad (3)$$

$$G_{tf}(z) = \frac{T_s}{\tau_{tf} + T_s - \tau_{tf} \cdot Z^{-1}} \qquad (4)$$

Moreover, torque controller 105 receives the actual torque command value. Torque controller 105 controls an applied torque so that a torque generated by the motor matches the actual torque command value. In general, however, there occurs an error or a delay between the actual torque command value and the torques generated by the motor. The transfer function of torque controller 105 is thus denoted by Gtc(s).

Here, a transfer function of the torque generated by the motor in response to the torque command value is derived according to the transfer characteristic of vibration suppression controller 104 and the transfer characteristic of torque controller 105. The transfer function of the torque generated by the motor denoted as Gd(s) can be expressed by the following equation (5).

$$G_d(s) = G_{tf}(s) \cdot G_{tc}(s) \qquad (5)$$

The feedforward torque command value is output from feedforward controller 101. A transfer characteristic from the feedforward torque command value to the torque generated by the motor is equal to that given by the equation (5). Therefore, when feedforward controller 101 expressed by the equation (2) is used, the transfer characteristic of the position command value and the position detected value of the rigid load that represents controlled object 106 becomes that given by the equation (5). The position command value and the position detected value of the rigid load representing controlled object 106 do not match completely.

A part that cannot be achieved by the transfer function Gd(s) is assumed to be a feedforward error. In consideration of this feedforward error, a transfer function of feedforward controller 101 can be expressed by the following equation (6).

$$G_m^{-1}(s) = G_p^{-1}(s) \cdot G_d(s) \qquad (6)$$

In this embodiment, the transfer function of predistorter 102 is denoted by Gdm(s). Adjustment calculator 109 adjusts transfer function Gdm(s) to bring it close to transfer function Gd(s).

Description is provided next about operation of torque estimator 108. Torque estimator 108 receives position detected value xm. Torque estimator 108 calculates torque estimated value τc that is an estimated value of the torque generated by the motor, based on the received position detected value xm. A transfer function of torque estimator 108 is set to be the same with transfer function $Gm^{-1}(z)$ of the feedforward controller. In this instance, the transfer function of torque estimator 108 can be expressed, as an example, by the following equation (7).

$$\frac{\tau_c}{x_m} = J \cdot \frac{1}{T_s^2} \cdot \frac{1 - 2z^{-1} + z^{-2}}{1} \qquad (7)$$

Description is provided next about operation of adjustment calculator 109. In this embodiment, predistorter 102 is made up of an IIR filter. Transfer function Gs(z) of predistorter 102 in this instance can be expressed by the following equation (8).

$$G_s(z) = \frac{b_0 + b_1 \cdot z^{-1} + b_2 \cdot z^{-2} + \dots b_N \cdot z^{-M}}{1 + a_1 \cdot z^{-1} + a_2 \cdot z^{-2} + \dots a_M \cdot z^{-N}} \qquad (8)$$

Filter factors $a_i$ and $b_j$ used for adjustment calculator 109 are obtained by an adaptation law, where i is an integer from 1 to N, and j is an integer from 1 to M. These figures N and M are filtration degrees that can be any values, and the larger the values of N and M the better the accuracy of the filter that can be achieved. Note that a number of the calculations increases with increase in the values of N and M, and the calculations take longer to converge. Therefore, a fixed value of 3 or less, for instance, is assigned to each of the figures N and M.

Adjustment calculator 109 receives torque command value tin, and torque estimated value τc that is an output of torque estimator 108. Adjustment calculator 109 calculates a filter factor of the equation (8) by using the torque command value in as an input of transfer function Gs(z), and the torque estimated value τc as an output of transfer function Gs(z). Adjustment calculator 109 calculates a factor of Gs(z) so that the transfer characteristic of predistorter 102 becomes equal to the transfer characteristic from the torque command value to the torque generated by the motor. The calculation of the filter factor is made by using a least squares method or an iterative least squares method, for example.

In the foregoing description, the motor has been illustrated as being a rotary type to generate a torque. The motor may also be a type that generates thrust force such as a linear motor. When this is the case, only the following substitutions are needed for the individual components in the above embodiment. That is, inertia that is a physical property of the controlled object is substituted by mass, and torque that is a manipulation quantity is substituted by thrust force. By implementing the substitutions as stated above, similar advantages can also be achieved.

Moreover, the description provided in this embodiment is a case in which the state quantity represents a position. The state quantity may instead be a speed. Similar advantages can also be achieved in this case when the transfer characteristic of the feedforward controller is in reverse of the transfer characteristic of the state quantity corresponding to the manipulation quantity of the controlled object.

In this embodiment, the manipulation quantity represents a torque, and the manipulation-quantity estimated value is calculated by estimating from the state-quantity detected value. The motor control device may have the following structure as another exemplary embodiment. That is, the motor control device manages a current value as to be the manipulation quantity. The motor control device includes a manipulation quantity detector and a manipulation quantity estimator. The manipulation quantity detector detects an electric current that is a manipulation quantity, and outputs the detected electric current as a manipulation quantity detected value. The manipulation quantity estimator estimates a manipulation-quantity estimated value from the manipulation quantity detected value, and outputs the manipulation-quantity estimated value.

Moreover, the vibration suppression controller in this embodiment is made of an IIR low pass filter. As another exemplary embodiment, the vibration suppression controller may be a filter that can remove specific frequency components to suppress the machine resonance.

To be specific, the vibration suppression controller may be a filter made of an IIR notch filter. Or, the vibration suppression controller may be a filter made of a plurality of IIR notch filters, or a combination of an IIR low pass filter and a plurality of IIR notch filters.

Alternatively, the vibration suppression controller may be a filter made of an FIR notch filter. Or, the vibration suppression controller may be a filter made of a combination of an FIR notch filter and a plurality of IIR notch filters and FIR notch filters, or a combination of an IIR low pass filter and a plurality of IIR notch filters and FIR notch filters.

In this embodiment, the predistorter is made of an IIR filter. In another embodiment, the predistorter may be an FIR filter.

Moreover, the predistorter in this embodiment has a fixed filtration degree. In another embodiment, the configuration may be such that the predistorter has a variable filtration degree, and the adjustment calculator determines optimum values of filtration degree and filter factor by changing them by using a learning rule.

Furthermore, the adjustment calculator in this embodiment has a configuration that adjusts the predistorter at all times. In another embodiment, the adjustment calculator may have such a configuration that adjusts the predistorter only when the feedback manipulation quantity exceeds a threshold.

Second Exemplary Embodiment

Illustrated next as a second exemplary embodiment is a motor control device of another concrete example.

Figure 2:
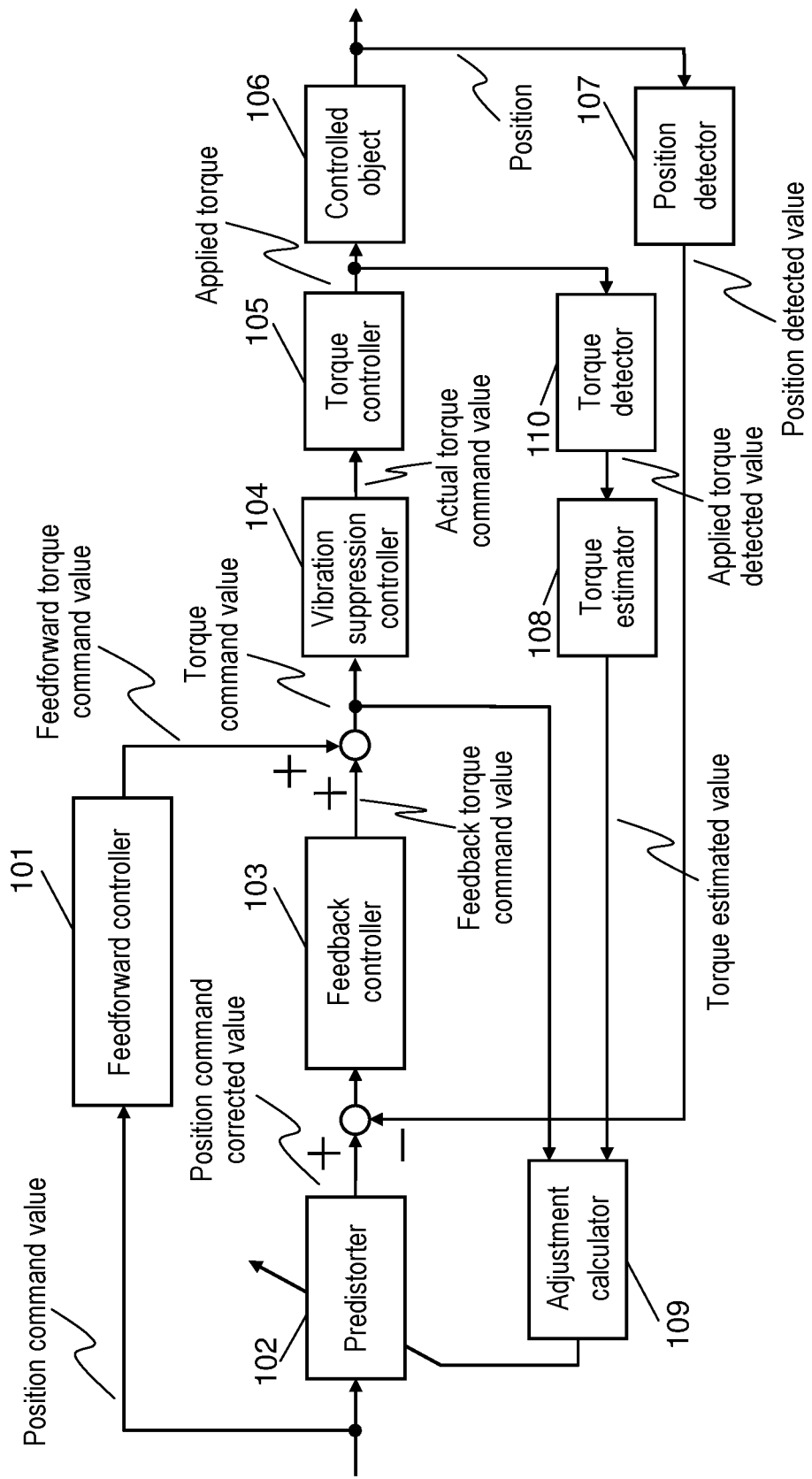
FIG. 2 is a block diagram showing a motor control device according to a second exemplary embodiment of the present invention.
Figure 3:
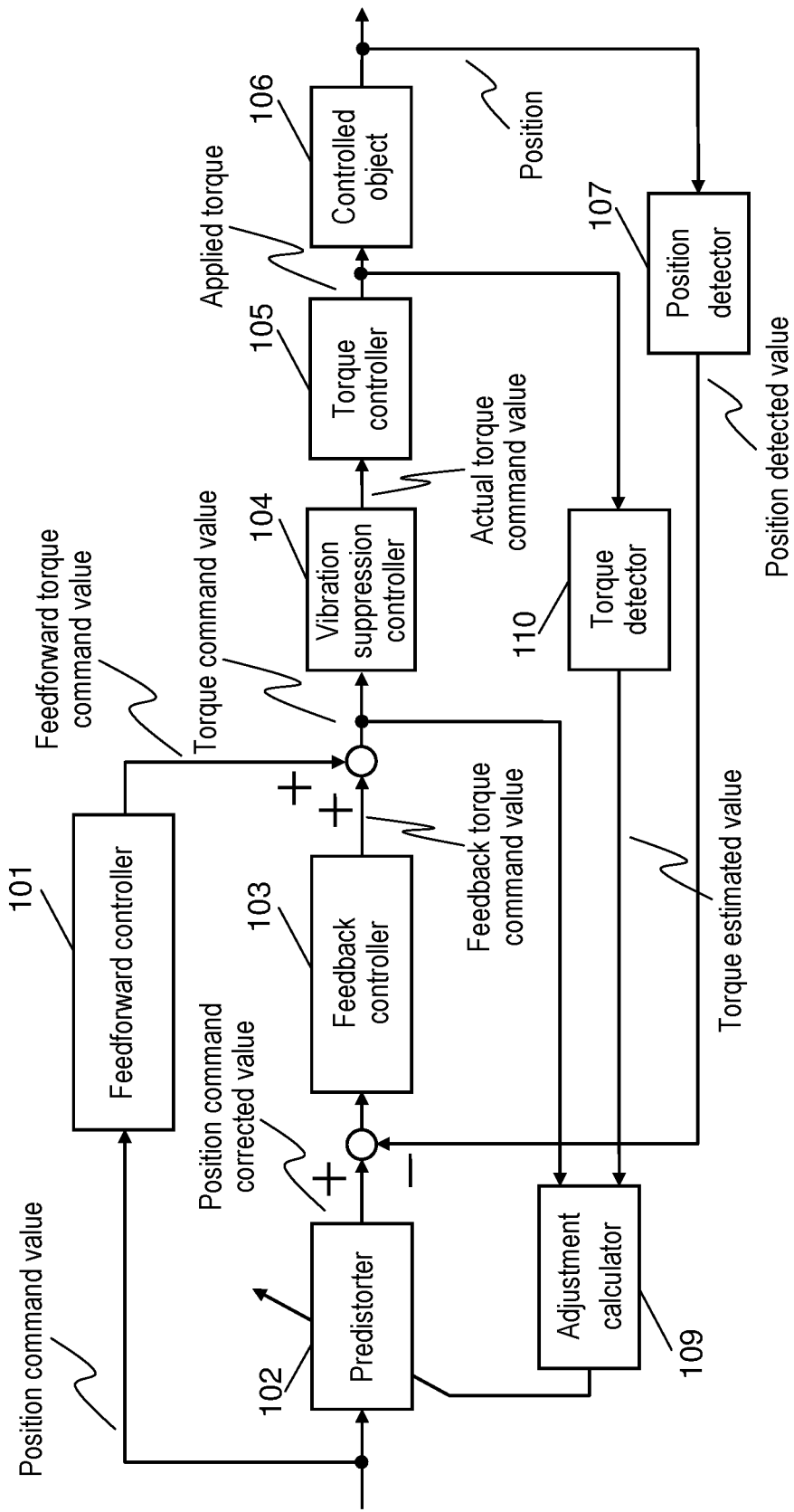
FIG. 3 is a block diagram showing another motor control device according to the second exemplary embodiment of the present invention.
Figure 4:
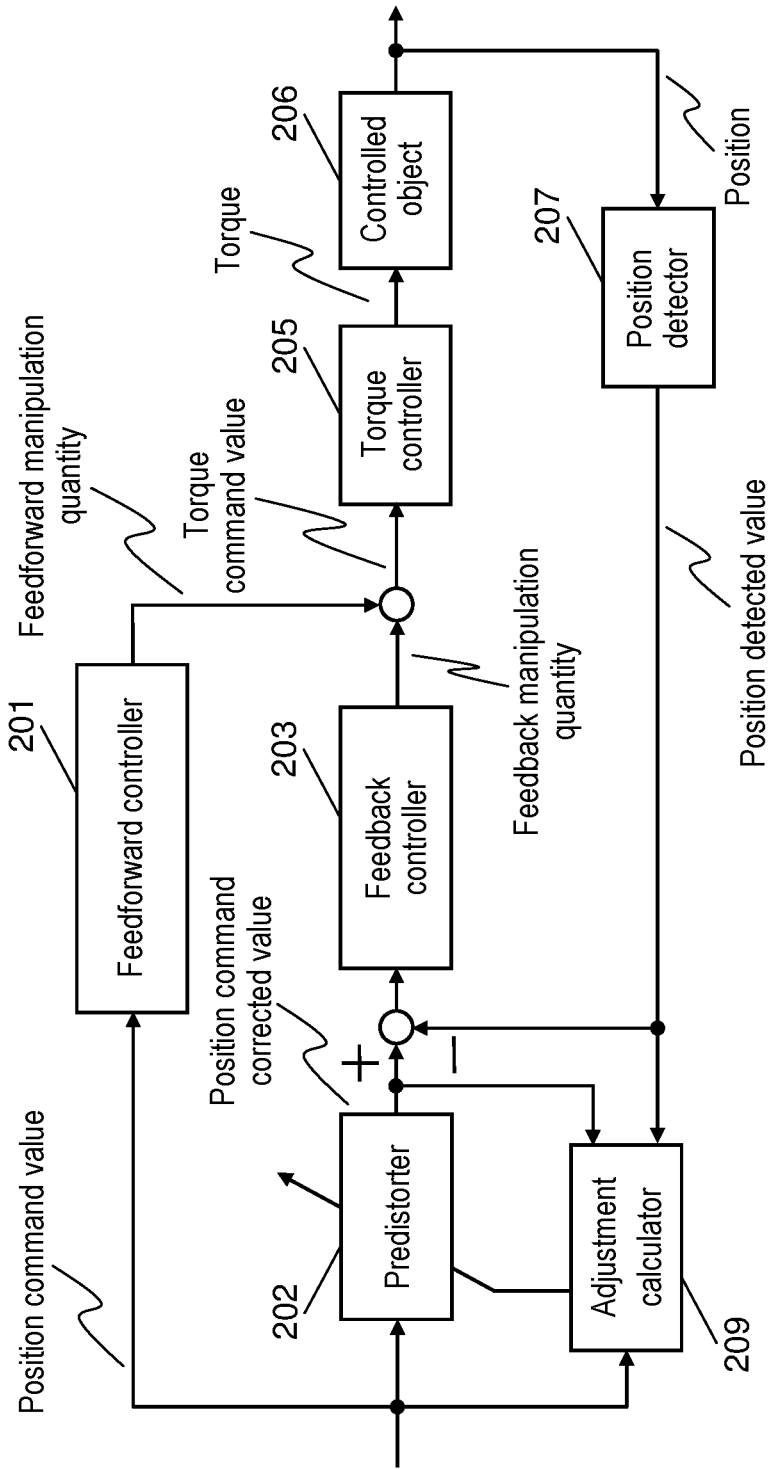
FIG. 4 is a block diagram showing a conventional motor control device.

FIG. 2 is a block diagram showing the motor control device according to the second exemplary embodiment of the present invention. FIG. 3 is a block diagram showing another motor control device according to the second exemplary embodiment of the invention.

As shown in FIG. 2, the motor control device according to the second exemplary embodiment of the invention further includes an applied manipulation quantity detector that can be implemented, for instance, by torque detector 110. The applied manipulation quantity detector illustrated as torque detector 110 in FIG. 2 detects a manipulation quantity, and outputs the manipulation quantity as an applied manipulation-quantity detected value. The applied manipulation-quantity detected value is shown as an applied torque detected value.

The motor control device shown in the second embodiment differs in the following aspect from the motor control device of the first embodiment described above.

That is, a manipulation quantity estimator that can be implemented by torque estimator 108, for instance, receives the applied manipulation-quantity detected value shown as an applied torque detected value, instead of a state-quantity detected value shown as a position detected value. Torque estimator 108, that is a manipulation quantity estimator, outputs a manipulation-quantity estimated value corresponding to the received applied manipulation-quantity detected value. The manipulation-quantity estimated value is shown as a torque estimated value.

Alternatively, the motor control device in the second embodiment of this invention may include, for instance, an applied manipulation quantity detector that can be implemented by torque detector 110 shown in FIG. 3, instead of the manipulation quantity estimator shown as torque estimator 108 in FIG. 1. The applied manipulation quantity detector shown as torque detector 110 in FIG. 3 receives an input of manipulation quantity. The applied manipulation quantity detector then outputs a manipulation-quantity estimated value. The manipulation quantity is shown as a torque, and the manipulation-quantity estimated value is shown as a torque estimated value.

Note that other components having the same configurations as those described in the first exemplary embodiment above are marked with the same reference numerals, and are referred to their corresponding descriptions.

According to the configuration described above, there exhibit the following advantages and effectiveness in addition to those described in the first exemplary embodiment. In other words, an amount of deviation between the manipulation-quantity estimated value and the manipulation quantity generated by the motor can be reduced by virtue of this configuration. As a result, the motor control device of this exemplary embodiment can achieve high following performance during adjustment of predistorter 102.

INDUSTRIAL APPLICABILITY

A motor control device according to the present invention is capable of reducing vibrations attributed to roughness of resolution detected by a state quantity detector, as well as vibrations attributed to resonance of mechanical system. The motor control device of the present invention is also capable of making adjustment of a predistorter without reducing control gain of a feedback controller. Thus, by use of the motor control device of this invention, high following performance can be achieved even when adjustment of the predistorter is being carried out. The motor control device of the invention is hence useful for such applications as a driving actuator in a mounting machine of electronic components and manufacturing equipment of semiconductors.

The invention claimed is:

1. A motor control device comprising:
a state quantity detector for detecting a movement of a motor, calculating a quantity of the movement, and outputting the calculated quantity of the movement as a state-quantity detected value;
a feedforward controller for receiving a state-quantity command value that directs the movement, and outputting a feedforward manipulation quantity corresponding to the received state-quantity command value;
a variable predistorter for receiving the state-quantity command value, and outputting a state-quantity command corrected value produced by correcting the received state-quantity command value;
a feedback controller for receiving a difference between the state-quantity command corrected value and the state-quantity detected value, and outputting a feedback manipulation quantity corresponding to the received difference between the state-quantity command corrected value and state-quantity detected value;
a vibration suppression controller for receiving a manipulation-quantity command value that is a value derived by addition of the feedforward manipulation quantity and the feedback manipulation quantity, and outputting an actual manipulation-quantity command value corresponding to the received manipulation-quantity command value;
a manipulation quantity controller for controlling a manipulation quantity generated by the motor such that the manipulation quantity matches the actual manipulation-quantity command value;
a manipulation quantity estimator for receiving the state-quantity detected value, and outputting a manipulation-quantity estimated value corresponding to the received state-quantity detected value; and
an adjustment calculator for adjusting a transfer characteristic of the predistorter,
wherein the adjustment calculator adjusts the transfer characteristic of the predistorter such that the transfer characteristic becomes equal to a transfer characteristic from the manipulation-quantity command value to the manipulation quantity.

2. The motor control device of claim 1 further comprising an applied manipulation quantity detector for detecting the manipulation quantity, and outputting the detected manipulation quantity as an applied manipulation-quantity detected value,
wherein the manipulation quantity estimator receives the applied manipulation-quantity detected value instead of the state-quantity detected value, and outputs a manipulation-quantity estimated value corresponding to the received applied manipulation-quantity detected value.

3. The motor control device of claim 1 comprising an applied manipulation quantity detector, in place of the manipulation quantity estimator,
wherein the applied manipulation quantity detector receives the manipulation quantity, and outputs a manipulation-quantity estimated value corresponding to the received manipulation quantity.

4. The motor control device of claim 1, wherein the feedforward controller and the manipulation quantity estimator include a computational algorithm of a same configuration.

5. The motor control device of claim 1, wherein the vibration suppression controller is made up of at least one infinite impulse response ("IIR") filter, at least one finite impulse response ("FIR") filter, or a combination of at least one IIR filter and at least one FIR filter.

6. The motor control device of claim 1, wherein the predistorter is made up of an IIR filter or an FIR filter.

7. The motor control device of claim 6, wherein the adjustment calculator corrects a filter factor of the IIR filter or the FIR filter by using a least-square method.

8. The motor control device of claim 7 further including a threshold for use in determining the feedback manipulation quantity, wherein
the adjustment calculator changes the filter factor of the predistorter when the feedback manipulation quantity exceeds the threshold, and
the adjustment calculator keeps the filter factor of the predistorter unchanged when the feedback manipulation quantity does not exceed the threshold.

9. The motor control device of claim 6, wherein the adjustment calculator corrects a filter factor of the IIR filter or the FIR filter successively by using an adaptive law.

10. The motor control device of claim 9 further including a threshold for use in determining the feedback manipulation quantity, wherein
the adjustment calculator changes the filter factor of the predistorter when the feedback manipulation quantity exceeds the threshold, and
the adjustment calculator keeps the filter factor of the predistorter unchanged when the feedback manipulation quantity does not exceed the threshold.

11. The motor control device of claim 6, wherein the adjustment calculator changes a filter factor and a filtration degree of the IIR filter or the FIR filter to obtain the filtration degree and the filter factor of such values that minimize a difference between the manipulation-quantity command value and the manipulation-quantity estimated value by using a learning rule.

12. The motor control device of claim 11 further including a threshold for use in determining the feedback manipulation quantity, wherein
the adjustment calculator changes the filter factor of the predistorter when the feedback manipulation quantity exceeds the threshold, and
the adjustment calculator keeps the filter factor of the predistorter unchanged when the feedback manipulation quantity does not exceed the threshold.

* * * * *